United States Patent
Jalan

(10) Patent No.: US 7,548,179 B2
(45) Date of Patent: Jun. 16, 2009

(54) MASH SIGMA DELTA MODULATOR

(75) Inventor: Saket Jalan, Karnataka (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/926,148

(22) Filed: Oct. 29, 2007

(65) Prior Publication Data

US 2009/0109076 A1    Apr. 30, 2009

(51) Int. Cl.
*H03M 3/00* (2006.01)

(52) U.S. Cl. ..................................... 341/143; 341/155

(58) Field of Classification Search .................. 341/143, 341/155
See application file for complete search history.

(56) References Cited

U.S. PATENT DOCUMENTS 7,071,787 B2 *   7/2006   Knierim et al. ............. 331/1 A

* cited by examiner

*Primary Examiner*—Jean B Jeanglaude
(74) *Attorney, Agent, or Firm*—Ronald O. Neerings; Wade James Brady, III; Frederick J. Telecky, Jr.

(57) ABSTRACT

A Multi-stage noise shaping Sigma Delta Modulator (MSDM) and method of processing data using the MSDM are disclosed. The MSDM is capable of operating at high radio frequencies and is characterized by low power consumption, reduced latency and noise and occupies less area in an integrated circuit.

19 Claims, 4 Drawing Sheets

MASH SIGMA DELTA MODULATOR

FIELD OF THE INVENTION

The present invention generally relates to signal processing and more specifically relates to signal processing using a Multi Stage Noise Shaping (MASH) sigma delta modulator.

BACKGROUND

Sigma delta modulators are typically used for analog to digital or digital to analog data conversion. In communications field, sigma delta modulators are typically used in digital radio processor (DRP) transmitter chains for digital to analog data conversion. These DRP transmitters operate in the giga-hertz (GHz) frequency range. At such high frequency of operation and the need for increased bit resolution results in requiring a high number of bits to be processed. As such, the digital sigma delta sigma modulators are embedded in integrated circuits implemented in parallel pipeline stages. A pipeline is a set of data processing elements that are connected in series so that the output of one element is the input to the next element in the chain. Parallel pipelines are implemented to process a number of data bits simultaneously to increase throughput. However, the use of parallel pipeline stages requires additional circuit elements such as delay elements (e.g. buffers or flip-flops) for bits alignment and synchronization. The use of delay elements increases the output latency. It also leads to increased area requirement for embedding the delay elements in the integrated circuit. Further, these delay elements consume power resulting in increased overall power consumption. Yet further, the use of additional circuit elements in the sigma delta modulators introduces noise to the radio frequency (RF) stages of the transmitter chains.

FIG. 1 shows a prior art 1-bit accumulator 100, which is a basic building block of a Multi-stage noising shaping Sigma Delta Modulator (MSDM). Typically, the one-bit accumulator 100 includes a full adder 105 and delay elements 110 and 115. The adder 105 receives a 1-bit data input, D_in, and a 1-bit carry input data, C_in, as shown. The output sum from the adder 105 is fed into the delay element 110 before being fed back to the adder 105. The adder 105 also generates a 1-bit carry out data, C_out, which is fed to the delay element 115. Throughout the disclosure, the 1-bit accumulator 100 is represented by a simplified graphical representation 120 as shown in FIG. 1.

FIG. 2 shows a prior art example of a parallel pipeline two-stage MSDM 200 capable of processing two data bits operating at 2 GHz frequency. Typically, in practice, more than two data bits are processed. The example of FIG. 2 is used as an illustration only. The MSDM 200 includes first stage accumulators 210 and 230 and second stage accumulators 220 and 240. Accordingly, the first stage accumulator 210 and second stage accumulator 220 form a first pipeline and the first stage accumulator 230 and second stage accumulator 240 form a second pipeline. Looking at the first stage, the input data into the MSDM 200 is separated into individual bits such that bit 1 is fed into accumulator 210 via a delay element 205 and bit 2 is fed directly into accumulator 230. The purpose of the delay element 205 is to synchronize the time of bits arrival at accumulators 210 and 230. Looking at the second pipeline, the output sum from accumulator 230 is fed to accumulator 240 via a delay element 235. The output carry bits from accumulators 230 and 240 are fed directly into accumulators 210 and 220, respectively. At the first pipeline, the output sum from accumulator 210 is fed to accumulator 220 via a delay element 215. The output carry bit from accumulator 210 is fed to a combiner 250 via a delay element 245 and the output carry bit from accumulator 220 is also fed to the combiner 250 where the processed bits are combined to provide a final processed output data.

Delay elements 215 and 235 are consequential of concatenating two 1-bit accumulators. These delay elements ensure that bits going into the second stage accumulators are synchronized. In practice, when more bits are processed and the number of stages increases, the number of delay elements needed is correspondingly increased. This contributes to increased latency, power consumption and greater area occupancy in the integrated circuit. Accordingly, there is a need for a multi-stage noise shaping sigma delta modulator that can be synthesized in an integrated circuit to operate at high speed with reduced power consumption, area requirement, noise, and latency.

BRIEF DESCRIPTION OF THE DRAWINGS

The present invention is described herein, by way of example only, with reference to the accompanying drawings, wherein.

DETAILED DESCRIPTION

A Multi-stage Sigma Delta Modulator (MSDM), a method of processing data using the MSDM and an integrated circuit (IC) incorporating the MSDM are disclosed. The MSDM according to embodiments of the present invention is characterized by low power consumption, reduced latency and noise and occupies substantially less area in an integrated circuit.

Figure 3:
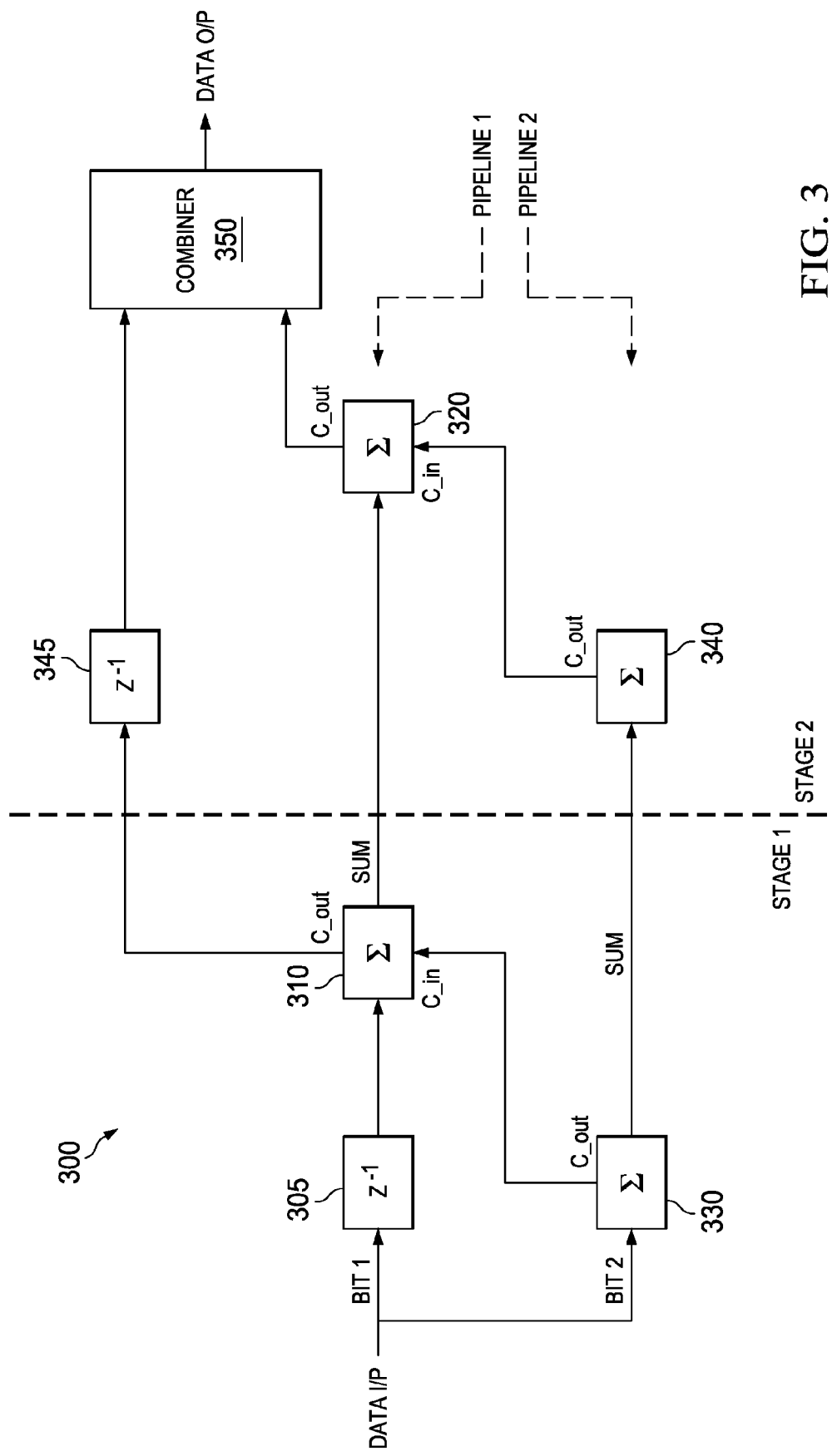
FIG. 3 shows a second order Multi-stage noise shaping Sigma Delta Modulator (MSDM0 according to an embodiment of the present invention in which two bits of data are processed.

FIG. 3 shows a parallel pipeline two-stage MSDM 300 according to an embodiment that is capable of processing two data bits operating at 2 GHz frequency. The MDSDM 300 includes first stage accumulators 310 and 330 and second stage accumulators 320 and 340. The first stage accumulator 310 and second stage accumulator 320 form a first pipeline and the first stage accumulator 330 and second stage accumulator 340 form a second pipeline. Each of the accumulators is a 1-bit accumulator. Looking at the first stage, the input data into the MSDM 300 is separated into individual bits (not shown) such that bit 1 is fed into accumulator 310 via a delay element 305 and bit 2 is fed directly into accumulator 330. The purpose of the delay element 305 (typically, a flip-flop) is to synchronize the time of bits arrival at accumulators 310 and 330. Looking at the second pipeline, the output sum from accumulator 330 is fed directly to accumulator 440. The output carry bits from accumulators 330 and 340 are fed directly into accumulators 310 and 320, respectively, as shown in FIG. 3. At the first pipeline, the output sum from accumulator 310 is fed directly to accumulator 320. The output carry bit from accumulator 310 is fed to a combiner 350 via a delay element 345 and the output carry bit from accumulator 320 is also fed to the combiner 250 where the bits are combined (i.e. assembled) to provide a final processed output data.

Figure 1:
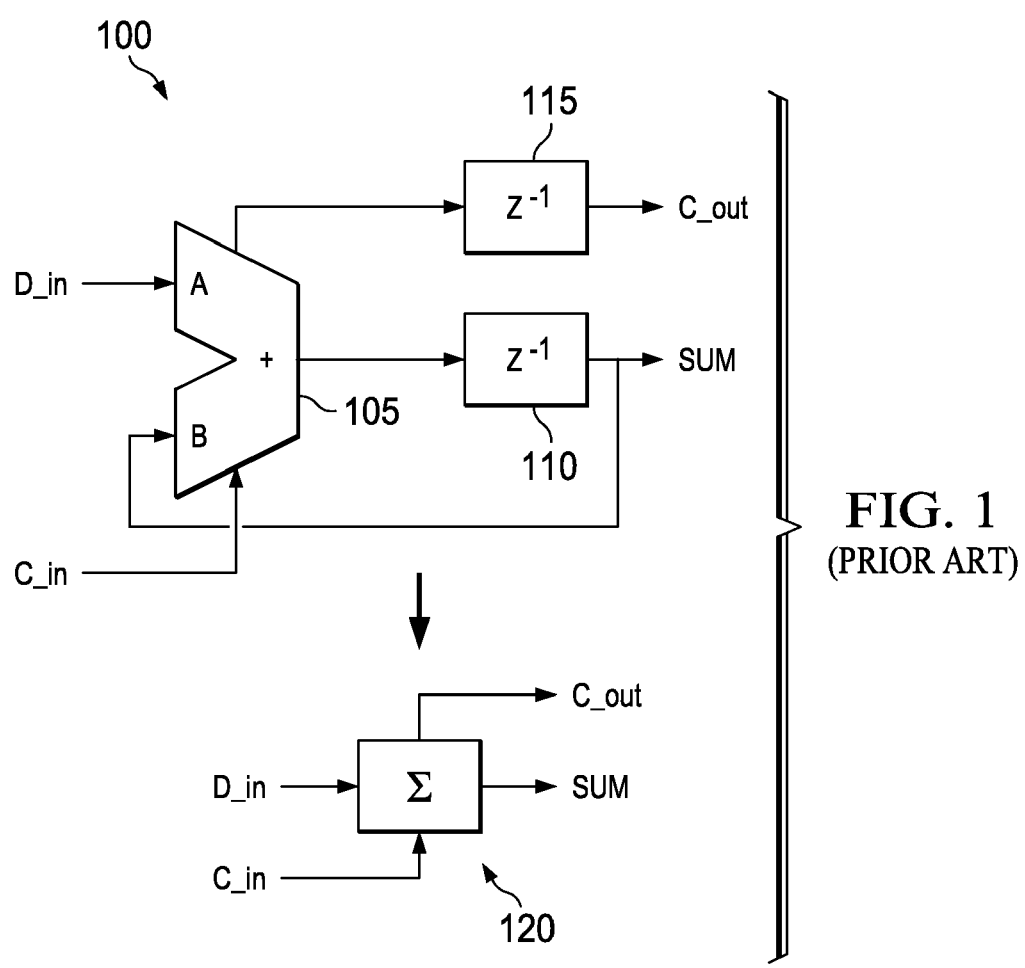
FIG. 1 shows a prior art block diagram of a 1-bit accumulator and its simplified graphical representation.
Figure 2:
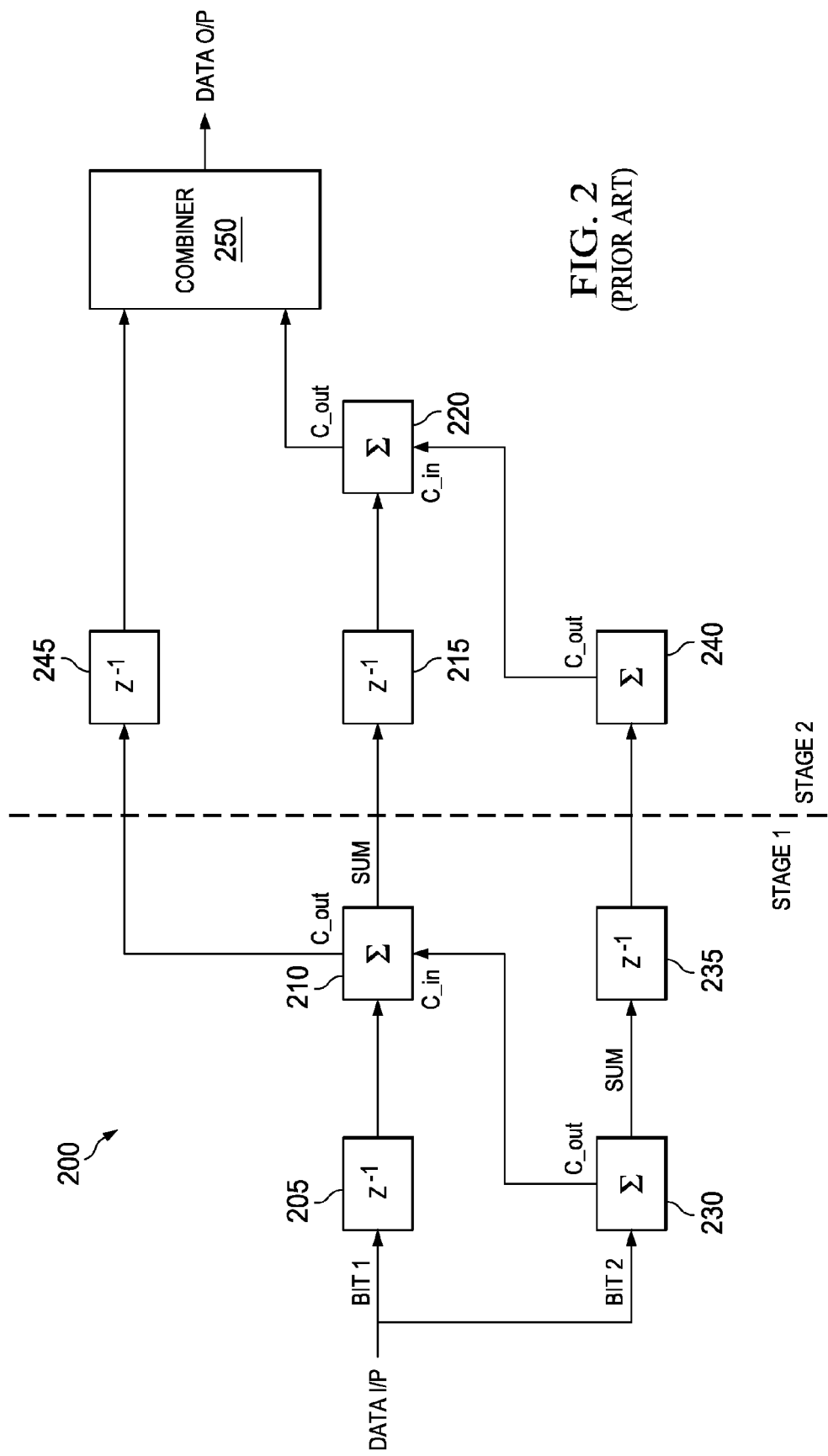
FIG. 2 shows a prior art block diagram of a second order multi-stage noise shaping sigma delta modulator in which 2 bits of data are processed.

Unlike in the prior art of FIG. 2, the output sums from accumulators 310 and 330 are directly fed to accumulators 320 and 340, respectively. The elimination of two delay elements (i.e. delay elements 215 and 235 as seen in FIG. 2) from FIG. 3 is based on the realization that the two delays are by-products of concatenating two 1-bit accumulators. In this case, the two delays are redundant and thus can be removed from the multi-stage sigma delta modulator implementation.

The MSDM 300 as shown in FIG. 3 is exemplary only. The same principle can be applied to numerous pipelines (i.e. N-bits) and the data bits can be processed over a number of stages depending on the resolution requirements. Accordingly, the higher the number of pipelines and stages (i.e. increased concatenation of stages), the higher the number of delay elements that can be removed and this results in substantial savings in power consumption, reduced latency, noise and area requirement. For example, for a six pipelines (i.e. 6 bits) two-stage MSDM implementation, a total of 35 delay elements can be eliminated out of the original total of 50 delay elements. Of the 35 delay elements, 30 are saved directly between stage 1 and stage 2, while the remaining five delay elements are saved between stage 1 and the combiner.

Figure 4:
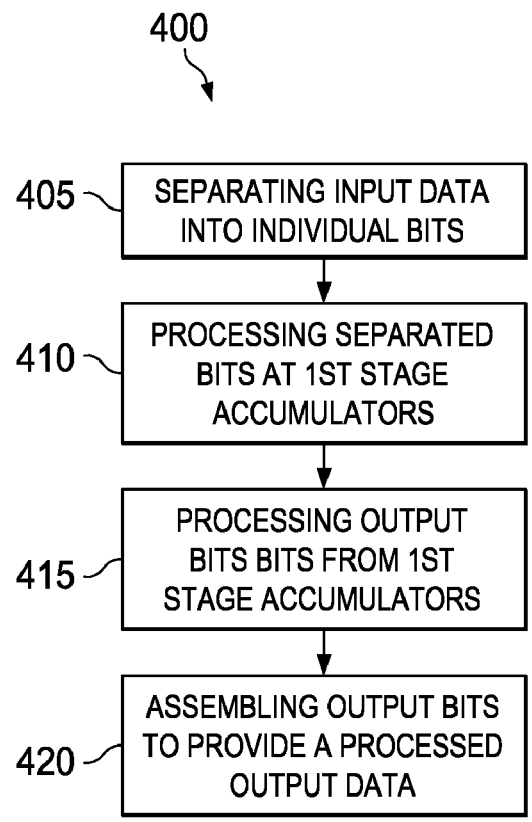
FIG. 4 shows a flowchart of a method of processing an input data using an MSDM according to an embodiment of the present invention.

FIG. 4 shows a flowchart of a method 400 of processing an input data using an MSDM according to an embodiment of the present invention. In step 405, after receiving an input data, the input data is separated into individual bits so that the bits can be processed in parallel pipelines. The number of individual bits determines the number of pipelines in the MSDM implementation. These bits are fed to first stage accumulators for processing in step 410. To ensure all bits arrive at substantially the same time at the first stage accumulators, the first bit is delayed N−1 times before reaching a first stage accumulator (i.e. a first pipeline) and the second bit is delayed N−2 times before reaching a corresponding first stage accumulator (i.e. a second pipeline) with the last bit N is fed directly into a corresponding first stage accumulator (i.e. $N^{th}$ pipeline) without any delay. Further, carry out bits from accumulators of bit N (i.e. $N^{th}$ pipeline) are directly fed as carry in bits to accumulators of bit N−1 (i.e. $(N-1)^{th}$ pipeline) within the first stage accumulators.

In step 415, the output sums from the first stage accumulators are correspondingly and directly fed to second stage accumulators for further processing. Similarly, carry out bits from accumulators of bit N are directly fed as carry in bits to accumulators of bit N−1 within the second stage accumulators. In the same manner, the output sums from the second stage accumulators can be correspondingly and directly fed to third stage accumulators for further processing, in the case of a three stage MSDM implementation. This process may be continued ad infinitum depending on the level of accuracy required.

In step 420, the carry out bits from each of the first bit accumulators (i.e. first pipeline) are fed to a combiner where the carry out bits are assembled to provide a processed output data. In the case of a two stage MSDM implementation, the carry out bit from the first stage accumulator of the first pipeline is delayed by one time in order to synchronize the time of arrive with the carry out bit from the second stage accumulator of the first pipeline at the combiner.

Figure 5:
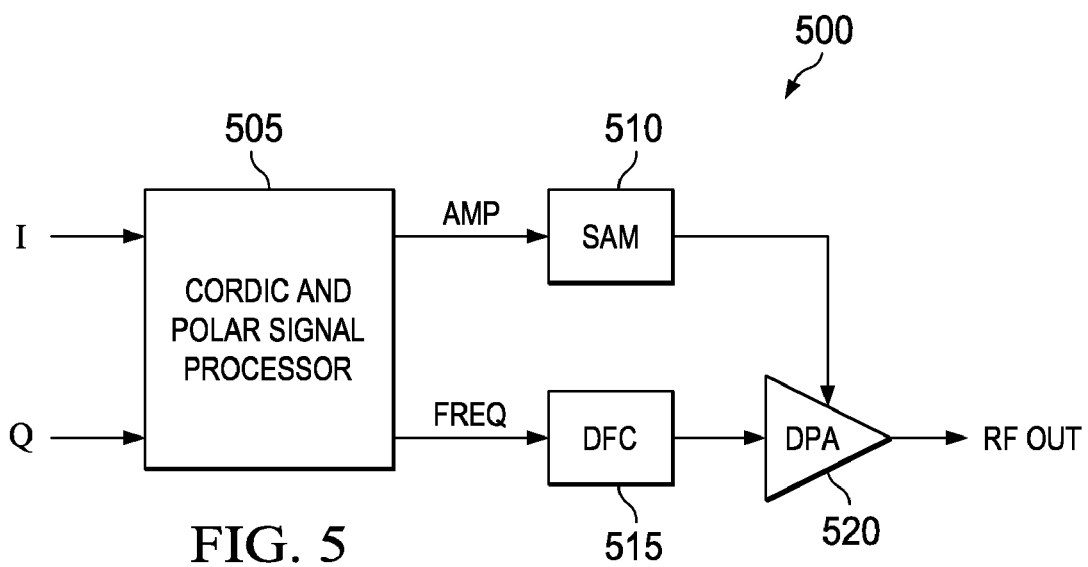
FIG. 5 shows a partial high level block diagram of a digital radio processor transmitter chain wherein an MSDM according to an embodiment of the present invention is employed.

To further illustrate the advantages of the MSDM of the present invention, FIG. 5 shows a partial high level block diagram of a digital radio processor (DRP) transmitter chain 500 wherein the MSDM is employed. The DRP transmitter chain includes a coordinate rotation digital computer (CORDIC) and polar signal processing unit 505 coupled to a sigma-delta amplitude modulation (SAM) unit 510 and digital frequency conversion (DFC) unit 515 as shown in FIG. 5. The outputs from the SAM 510 and DFC 515 are feed to a digitally controlled power amplifier (DPA) 520 where RF output is provided for further processing (not shown). Internally, SAM 510 has two portions, namely, an integer portion and a fractional portion. The fractional portion consists of a high speed (i.e. 2 GHz) sigma delta modulator. Since SAM 510 is physically located adjacent to the pre-power amplification stage in the transmitter chain. As a result, any supply noise introduced by SAM 510 directly affects the performance of the pre-power amplifier stage. Accordingly, when the prior art high speed sigma delta modulator is replaced by the MSDM of the present invention, the reduced number of delay elements (i.e. flip-flops) significantly reduces noise introduction by SAM 510.

Further, the reduced number of delay elements translates into significant power consumption reduction. For example, a prior art sigma delta modulator implementation in the DRP transmitter chain 500 typically consumes an average of 100 uA of current per flip-flop operating at 2 GHz. The removal of, for example, 34 flip-flops translates into a saving of 3 mA of operating current from the system. Accordingly, the latency and area requirement are correspondingly reduced.

From the foregoing, it will be appreciated that the present invention provides a novel and optimized a multi-stage sigma delta modulation capable of operating at high speed. Although embodiments of the present invention have been described and illustrated, the present invention is not to be limited to the specific forms or arrangements or parts so described and illustrated. It is anticipated that numerous modifications and changes will readily occur to those skilled in the art. Accordingly, it will be appreciated that all suitable variations, modifications and equivalents may be resorted to, falling within the spirit and scope of the present invention.

What is claimed is:

1. A multi-stage sigma delta modulator comprising:
   first stage accumulators coupling directly to corresponding second stage accumulators for processing input data bits; and
   a combiner for assembling outputs from the accumulators to provide a processed output data.

2. The modulator of claim 1, wherein each of the accumulators is a 1-bit accumulator.

3. The modulator of claim 1, wherein the number of first stage accumulators equals the number of second stage accumulators with each pair of a first stage accumulator and corresponding second stage accumulator forming a pipeline, the number of pipelines equals to the number of input data bits with the first bit being processed at the first pipeline and the $N^{th}$ bit being processed at the $N^{th}$ pipeline.

4. The modulator of claim 3, wherein the outputs from the accumulators are carry out bits from accumulators of the first pipeline.

5. The modulator of claim 3, further comprising a delay for delaying the first bit prior to feeding the first bit to the first stage accumulator of the first pipeline.

6. The modulator of claim 5, wherein the delay is configured to delay the arrival of the first bit at the first stage accumulator to substantially synchronize with the arrival of the $N^{th}$ bit at the first stage accumulator of the $N^{th}$ pipeline.

7. The modulator of claim 5, wherein the delay comprises N−1 flip-flops.

8. A method of processing data in a multi-stage sigma delta modulator, the method comprising:
  processing input data bits at first stage accumulators to provide first-stage carry out bits and sum outputs;
  processing the sum outputs from the first stage accumulators at second stage accumulators to provide second-stage carry out bits, wherein the second stage accumulators receive the sum outputs directly from corresponding first stage accumulators; and
  assembling first-stage and second-stage carry out bits to provide a processed output data.

9. The method of claim 8, wherein processing the input data bits comprises feeding each consecutive input data bit into a separate pipeline, wherein a pipeline comprises a first stage accumulator coupled directly to a second stage accumulator.

10. The method of claim 9, wherein processing the input data bits comprises delaying appropriate input data bits such that the input data bit in each pipeline arrives at the corresponding first stage accumulator at substantially the same time.

11. The method of claim 9, wherein assembling the carry out bits further comprises feeding the carry out bits of the first input data bit pipeline to a combiner.

12. The method of claim 11, further comprising delaying the carry out bit of the first stage accumulator of the first input data bit pipeline prior to feeding the carry out bit to the combiner.

13. An integrated circuit comprising:
  a processor;
  a sigma-delta amplitude modulation unit coupled to the processor;
  a digital frequency conversion unit coupled to the processor; and
  a power amplifier coupled to the sigma-delta amplitude modulation unit and the digital frequency conversion unit,
  wherein the sigma-delta amplitude modulation unit comprises a multi-stage sigma delta modulator comprising:
    first stage accumulators directly coupled to corresponding second stage accumulators for processing input data bits; and
    a combiner configured to assemble outputs from the accumulators to provide a processed output data.

14. The integrated circuit of claim 13, wherein each of the accumulators is a 1-bit accumulator.

15. The integrated circuit of claim 13, wherein the number of first stage accumulators equals the number of second stage accumulators with each pair of a first stage accumulator and corresponding second stage accumulator forming a pipeline, the number of pipelines equals to the number of input data bits with the first bit being processed at the first pipeline and the $N^{th}$ bit being processed at the $N^{th}$ pipeline.

16. The integrated circuit of claim 15, wherein the outputs from the accumulators are carry out bits from accumulators of the first pipeline.

17. The integrated circuit of claim 15, further comprising a delay for delaying the first bit prior to feeding the first bit to the first stage accumulator of the first pipeline.

18. The integrated circuit of claim 17, wherein the delay is configured to delay the arrival of the first bit at the first stage accumulator to substantially synchronize with the arrival of the $N^{th}$ bit at the first stage accumulator of the $N^{th}$ pipeline.

19. The integrated circuit of claim 17, wherein the delay comprises N−1 flip-flops.

* * * * *